United States Patent
von Blanckenhagen et al.

(10) Patent No.: US 9,229,331 B2
(45) Date of Patent: *Jan. 5, 2016

(54) EUV MIRROR COMPRISING AN OXYNITRIDE CAPPING LAYER HAVING A STABLE COMPOSITION, EUV LITHOGRAPHY APPARATUS, AND OPERATING METHOD

(71) Applicant: CARL ZEISS SMT GMBH, Oberkochen (DE)

(72) Inventors: Gisela von Blanckenhagen, Aalen (DE); Dirk Heinrich Ehm, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/227,784

(22) Filed: Mar. 27, 2014

(65) Prior Publication Data

US 2014/0211179 A1 Jul. 31, 2014

Related U.S. Application Data

(63) Continuation of application No. PCT/EP2012/068320, filed on Sep. 18, 2012.

(60) Provisional application No. 61/539,702, filed on Sep. 27, 2011.

(30) Foreign Application Priority Data

Sep. 27, 2011  (DE) .......................... 10 2011 083 462

(51) Int. Cl.
G03B 27/70 (2006.01)
G02B 5/08 (2006.01)
(Continued)

(52) U.S. Cl.
CPC .................. G03F 7/702 (2013.01); B82Y 10/00 (2013.01); C23C 16/308 (2013.01);
(Continued)

(58) Field of Classification Search
USPC ........ 15/405; 134/1.1, 18, 35, 37; 355/30, 66, 355/67; 356/338; 359/359, 582, 584, 588; 427/558, 578, 579; 428/336; 204/192.15, 192.25; 378/35; 423/325; 430/5, 322
See application file for complete search history.

(56) References Cited

U.S. PATENT DOCUMENTS 5,773,100 A    6/1998   Chang et al.
2004/0151988 A1  8/2004   Silverman
(Continued)

FOREIGN PATENT DOCUMENTS

EP   1 065 568 A2    1/2001
WO   2009/059614 A1  5/2009
WO   2010/127845 A1  11/2010

OTHER PUBLICATIONS

"Deposition of silicon nitride layers. $Si_3N_4$", https://www.crystec.com/trinitre.htm, Jan. 21, 2014, pp. 1 von 3-3 von 3.
(Continued)

*Primary Examiner* — Bijan Ahvazi
(74) *Attorney, Agent, or Firm* — Edell, Shapiro & Finnan, LLC

(57) ABSTRACT

A mirror (13) for use e.g. in an EUV lithography apparatus or an EUV mask metrology system, with: a substrate (15) and a coating (16) reflective to EUV radiation (6), the reflective coating having a capping layer (18) composed of an oxynitride, in particular composed of $SiN_xO_y$, wherein a nitrogen proportion x in the oxynitride $N_xO_y$ is between 0.4 and 1.4. Also provided are an EUV lithography apparatus having at least one such EUV mirror (13) and a method for operating such an EUV lithography apparatus.

14 Claims, 3 Drawing Sheets

(51) Int. Cl.
    *G03F 7/20*     (2006.01)
    *G21K 1/06*     (2006.01)
    *C23C 16/30*     (2006.01)
    *B82Y 10/00*     (2011.01)
    *F21V 9/04*     (2006.01)
    *F21V 9/06*     (2006.01)
    *G02B 5/20*     (2006.01)
    *B05D 3/06*     (2006.01)

(52) U.S. Cl.
    CPC ......... *G02B 5/0891* (2013.01); *G03F 7/70316* (2013.01); *G03F 7/70958* (2013.01); *G21K 1/062* (2013.01); *G21K 2201/067* (2013.01)

(56) References Cited

U.S. PATENT DOCUMENTS

| | | |
|---|---|---|
| 2006/0066940 A1 | 3/2006 | Trenkler et al. |
| 2006/0138354 A1 | 6/2006 | Bakker et al. |
| 2008/0316595 A1 | 12/2008 | Van Herpen et al. |
| 2014/0211178 A1* | 7/2014 | Ehm et al. .............. 355/66 |

OTHER PUBLICATIONS

International Search Report, PCT/EP2012/068320, dated Mar. 6, 2013.
German Office Action, 10 2011 083 462.1, Jul. 9, 2012.
International Preliminary Report on Patentability and Written Opinion of the ISR for PCT/EP2012/068320, dated Apr. 1, 2014, 5 pages.

* cited by examiner

EUV MIRROR COMPRISING AN OXYNITRIDE CAPPING LAYER HAVING A STABLE COMPOSITION, EUV LITHOGRAPHY APPARATUS, AND OPERATING METHOD

CROSS-REFERENCE TO RELATED APPLICATIONS

This application is a Continuation Application of International Application No. PCT/EP2012/068320, filed on Sep. 18, 2012, which claims benefit under 35 U.S.C. 119(e) of U.S. Provisional Application No. 61/487,388, filed Sep. 27, 2011, and which claims priority under 35 U.S.C. §119(a) to German Patent Application No. 10 2011 083 462.1, filed Sep. 27, 2011. The entire disclosures of all three related applications are considered part of and are incorporated by reference into the disclosure of the present application.

FIELD OF AND BACKGROUND OF THE INVENTION

The present invention relates to a mirror comprising a substrate and a coating reflective to EUV radiation, an EUV lithography apparatus comprising at least one such mirror, and a method for operating such an EUV lithography apparatus. The mirror can also be used in a different optical device than an EUV lithography apparatus, e.g. in an EUV mask metrology system.

Projection exposure apparatuses for microlithography serve for producing microstructured components using a photolithographic method. In this case, a structure-bearing mask, the so-called reticle, is imaged onto a photosensitive layer with the aid of a projection optical unit. The minimum structure size that can be imaged with the aid of such a projection optical unit is determined by the wavelength of the imaging light used. The smaller the wavelength of the imaging light used, the smaller the structures that can be imaged with the aid of the projection optical unit. Imaging light having the wavelength of 193 nm or—in so-called EUV lithography apparatuses—imaging light having a wavelength in the range of the extreme ultraviolet (EUV), i.e. 5 nm-30 nm, is principally used nowadays. Reflective optical elements (EUV mirrors) are exclusively used in EUV lithography apparatuses since no optical materials having a sufficiently high transmission at these wavelengths are known.

An EUV mirror for such an EUV lithography apparatus comprises a substrate and a reflective coating having a plurality of layers, said reflective coating being applied to the substrate. Such a multilayer coating generally consists of alternating layers composed of materials having high and low refractive indices, e.g. alternating layers composed of molybdenum and silicon, the layer thicknesses of which are coordinated with one another such that the coating fulfils its optical function and a high reflectivity is ensured. The multilayer coating typically has a capping layer in order to protect the underlying layers against oxidation or other degradation mechanisms. Said capping layer can consist of a metallic material, e.g. of ruthenium, rhodium or palladium.

EP 1 065 568 A2 discloses using carbides as materials for the capping layer, e.g. boron carbide ($B_4C$) or silicon carbide (SiC). Nitrides, for example silicon nitride ($Si_3N_4$) or titanium nitride (TiN), are also specified there as materials for the capping layer. Analogously, US 2006/0066940 A1 describes an EUV mirror comprising a capping layer system, wherein alongside silicon nitride ($Si_3N_4$) boron nitride (BN), too, and alongside boron carbide ($B_4C$) molybdenum carbide (MoC), too, are proposed as materials for the capping layer system.

US 2008/0316595 A1 has also disclosed a multilayer mirror for EUV applications, wherein silicon nitride, inter alia, is used as capping layer material. Since the substrate materials of EUV mirrors typically cannot withstand excessively high temperatures, it is proposed therein to implement the capping layer utilizing chemical vapor deposition (CVD) involving plasma enhanced chemical vapor deposition (PE-CVD) or low pressure chemical vapor deposition (LP-CVD). These coating methods allow a deposition at lower temperatures than is the case for a conventional chemical vapor deposition.

Capping layers composed of silicon nitride have the advantage that they have a comparatively low adhesion rate for metal deposits such as e.g. tin, such that EUV mirrors comprising such capping layers can be used e.g. in the vicinity of LPP (laser produced plasma) light sources, which can release gaseous tin. Moreover, a capping layer composed of silicon nitride on which tin has deposited can generally be completely freed of the tin deposits by cleaning using activated hydrogen (e.g. in the form of hydrogen radicals or hydrogen ions). By contrast, in the case of capping layers composed of ruthenium, for example, there is often the problem that, even after such hydrogen cleaning, tin residues remain on the surface of the capping layer and lead to a degradation of the reflectivity and/or the uniformity of the reflectivity of the EUV mirror.

During exposure operation of an EUV mirror comprising a capping layer composed of silicon nitride in an EUV lithography apparatus, it has been found that, during hydrogen cleaning of the capping layer, often it has not been possible to achieve the expected result, namely reversible cleaning of the surface of the capping layer to remove tin deposits or carbon deposits.

OBJECTS AND SUMMARY OF THE INVENTION

It is an object of the invention to provide an EUV mirror and an EUV lithography apparatus comprising such an EUV mirror which have an improved stability of their optical properties during exposure operation in an EUV lithography apparatus, and also a method for operating an EUV lithography apparatus which increases the stability of the optical properties of an EUV mirror.

This object is achieved, according to one formulation, by a mirror of the type mentioned in the introduction wherein the coating has a capping layer composed of an oxynitride, in particular composed of silicon oxynitride ($SiN_xO_y$), wherein a nitrogen proportion x in the oxynitride $N_xO_y$ is between 0.4 and 1.4. The inventors have recognized that a capping layer composed of silicon nitride ($Si_3N_4$ or $SiN_x$) is converted into silicon oxynitride ($SiN_xO_y$) during the irradiation with (intensive) EUV radiation in the residual gas atmosphere which prevails during exposure operation in an EUV lithography apparatus, or—depending on the deposition method used—possibly under disadvantageous ambient conditions even before introduction into the EUV lithography apparatus, i.e. the nitrogen in the silicon nitride material ($Si_3N_4$ or $SiN_x$) is at least partly replaced by oxygen. Such replacement or conversion of nitrides into oxynitrides typically appears not only in the case of silicon nitride or in the case of silicon oxynitride, but also in the case of other oxynitride compounds, in particular in the case of compounds of oxynitrides $N_xO_y$ with other semiconductors or with metals or semimetals.

Since the conversion of a nitride capping layer into an oxynitride capping layer during the EUV irradiation is dependent on the ambient conditions in the EUV lithography apparatus, in particular on the gas constituents of the residual gas atmosphere and on the intensity of the EUV radiation, and the temporal profile of the conversion can therefore be predicted only with difficulty, it is proposed to provide an EUV mirror with an oxynitride capping layer, i.e. with a capping layer in which nitrogen has already been partly replaced by oxygen. What can be achieved in the case of such a capping layer is that its composition, in particular its nitrogen content or proportion, is kept (approximately) constant during the operation of the EUV mirror in the EUV lithography apparatus throughout its lifetime. Alongside compounds of oxynitride $N_xO_y$ with semiconductors, e.g. with silicon, as materials for the capping layer it is also possible, if appropriate, to use compounds of oxynitride $N_xO_Y$ with a metallic constituent, e.g. with titanium, zirconium or aluminum, or with semimetals, e.g. with boron.

It has proved to be advantageous to apply the capping layer by physical vapor deposition (PVD), in particular by sputtering (cathode sputtering). PVD methods have the advantage that they can be carried out at comparatively low temperatures, and so the substrate material is not damaged during coating. Sputtering can be carried out using a magnetron, for example as described in WO 2010/127845 A1, wherein so-called "High Power Impulse Magnetron Sputtering (HiP-IMS)" and "High Power Pulsed Magnetron Sputtering (HPPMS)" is used to form oxidic or nitridic layers. The method described in WO 2010/127845 A1 is intended to be suitable, in particular, for producing oxynitride layers having different proportions of oxygen and nitride. Inter alia, silicon nitride ($Si_3N_4$), silicon oxynitride ($SiN_xO_Y$) and, in particular, $Si_{3-2x}O_{2x}N_{4(1-x)}$ (where x is between 0 and 1) are specified as possible types of layers. The layers produced in the manner described therein can be used in antireflection coatings or as high refractive index layers in optical filters. According to the invention, the methods described therein can be used for producing silicon oxynitride capping layers in EUV mirrors.

The oxynitride capping layer can, if appropriate, also be applied via a chemical vapor deposition method (CVD method); in this case, however, the temperature of the substrate should be kept low during coating, which can be achieved by the use of PE-CVD or LP-CVD methods such as are described for the deposition of silicon nitride SiNx or $Si_{3+x}N_{4-y}$, i.e. of non-stochiometric silicon nitride, e.g. on the website of Crystec under http://www.crystec.com/trinitre-.htm, also cf. U.S. Pat. No. 5,773,100, which describes a vacuum deposition apparatus for the production of silicon nitride or of silicon oxynitride using a PE-CVD process.

In one embodiment of the EUV mirror, the capping layer is formed from $SiN_xO_Y$, in particular from amorphous $SiN_xO_y$. Amorphous silicon oxynitride is typically obtained in a PVD process, while CVD processes often lead to a crystalline material structure. Alongside $SiN_xO_Y$ other oxynitride compounds can also be produced in amorphous form with a PVD process.

Particularly in the case of deposition in a PVD process, a nitrogen proportion x in the oxynitride $N_xO_y$ can be between 0.4 and 1.4, preferably between 0.7 and 1.4, particularly preferably between 1.0 and 1.4. Generally, a nitrogen proportion x of greater than 1.0 has proved to be advantageous. Silicon oxynitride deposited, in particular, using a PVD process with suitably chosen parameters is low in nitrogen, i.e. it has a significantly lower nitrogen proportion than is predefined by the stoichiometry of silicon nitride ($Si_3N_4$). The nitrogen proportion of the silicon oxynitride can be varied within certain limits during coating, for example by suitably choosing the gas composition (in particular the nitrogen partial pressure) during coating in a vacuum coating apparatus.

Measurements on the capping layer have revealed that during deposition using a PVD process, a location-dependent variation of the composition within the layer can possibly occur, in which case it should be endeavored to chose the process parameters such that the capping layer has a composition that is as homogeneous as possible.

It has also proved to be advantageous if the oxygen proportion y in the oxynitride $N_xO_Y$ is y<0.4. A capping layer having a homogeneous $SiO_xN_y$ distribution where x=1.0 or x>1.0 and y=0.4 or y<0.4 is particularly advantageous.

The capping layer is preferably applied to a silicon layer of the reflective coating in order to promote the deposition of the silicon oxynitride material. The reflective coating typically has a plurality of individual layers consisting alternately of materials having different refractive indices. If EUV radiation at a wavelength in the range of 13.5 nm is used, then the individual layers usually consist of molybdenum and silicon. Other material combinations such as e.g. molybdenum and beryllium, ruthenium and beryllium or lanthanum and $B_4C$ are likewise possible. In addition to the individual layers described, a reflective coating can also comprise intermediate layers for preventing diffusion and the above-described capping layer for preventing oxidation or corrosion.

In a further embodiment, the reflective coating has a reflection maximum at an operating wavelength $\lambda_B$ in the EUV wavelength range and a maximum or a minimum of a standing wave that forms upon the reflection of radiation at the operating wavelength $\lambda_B$ in the reflective coating is arranged at a distance of $0.1\lambda_B$ or less from a surface of the capping layer which forms the interface between the capping layer and the surroundings. Ideally, the maximum or minimum of the standing wave lies exactly at the surface of the capping layer.

The inventors have found that a decrease in reflectivity as a result of the partial replacement of nitrogen by oxygen in the capping layer composed of silicon oxynitride turns out to be comparatively small (typically approximately 2% or less) if the maximum or the minimum of the standing wave is situated in the region of the surface of the capping layer or of the reflective coating. In order to achieve this, the optical design of the multilayer coating, in particular the layer thicknesses of the layers, can be chosen suitably. Thus, in particular the thickness of the capping layer and/or the thickness of the layer to which the capping layer is applied can be set such that the standing wave has a maximum or a minimum at the surface.

The ambient conditions (in particular the oxygen and nitrogen partial pressure) during operation of the EUV mirror in an EUV lithography apparatus are preferably chosen such that the nitrogen proportion is constant. If an (undesired, irreversible) replacement of nitrogen by oxygen in the capping layer composed of silicon oxynitride occurs, the measures described above can prevent this from having an excessively great effect on the reflectivity or the uniformity of the reflectivity of the EUV mirror.

The invention also relates to an EUV lithography apparatus, comprising: at least one EUV mirror as described above, which is arranged in a residual gas atmosphere. In this case, the residual gas atmosphere is formed in a vacuum environment of an (evacuated) housing of the EUV lithography apparatus. By suitably choosing the gas constituents of the residual gas atmosphere and/or by choosing suitable (not excessively high) power densities of the EUV radiation at the surface of the EUV mirror or at the capping layer thereof, it is possible for the nitrogen proportion of the layer composed of oxynitride to be kept constant (substantially) over the lifetime of the EUV mirror. If appropriate, during the irradiation of the EUV mirror, part of the nitrogen can also be replaced (generally irreversibly) by oxygen in a desired manner, such that the nitrogen proportion in the capping layer composed of oxynitride can also be set. In particular, the operating conditions of the EUV lithography apparatus can be chosen such that, in the case of a desired nitrogen proportion of the capping layer composed of silicon oxynitride, an equilibrium state is established in which the composition of the capping layer no longer changes during the irradiation.

In one embodiment, the capping layer or the surface thereof, during exposure operation, is subjected to EUV radiation having a power density of less than 2000 mW/mm$^2$, preferably of less than 1000 mW/mm$^2$, in particular of less than 500 mW/mm$^2$. It has proved to be advantageous if the surface of the capping layer is not subjected at any point to EUV radiation above the threshold values specified above, in order to counteract a destabilization of the capping layer by replacement of nitrogen by oxygen.

In one embodiment, the residual gas atmosphere has a nitrogen partial pressure $p(N_2)$ of between $10^{-2}$ mbar and $10^{-6}$ mbar, preferably between $10^{-3}$ mbar and $10^{-5}$ mbar, in particular of around approximately $10^{-4}$ mbar. Comparatively high nitrogen partial pressures counteract the replacement of nitrogen by oxygen in the capping layer.

In a further embodiment, the residual gas atmosphere has an oxygen partial pressure $p(O_2)$ of between $10^{-7}$ mbar and $10^{-11}$ mbar, preferably between $10^{-9}$ mbar and $10^{-11}$ mbar. In order to prevent or slow down a degradation of the capping layer, it has proved to be advantageous if the oxygen partial pressure in the residual gas atmosphere is significantly lower than the nitrogen partial pressure, to be precise typically by at least two, in particular by at least five, orders of magnitude.

In a further embodiment, the residual gas atmosphere has a partial pressure of water $p(H_2O)$ of between $10^{-5}$ mbar and $10^{-9}$ mbar, preferably between $10^{-6}$ mbar and $10^{-8}$ mbar, particularly preferably of around approximately $10^{-7}$ mbar. Since the vacuum housing in which the EUV mirrors are arranged generally cannot be baked out, the presence of water in the residual gas atmosphere typically cannot be completely avoided. However, the partial pressure of water should not be excessively high, in order to prevent (to the greatest possible extent) reactions—possibly induced by the EUV radiation—of the oxygen contained in the water with the capping layer.

In a further embodiment, the residual gas atmosphere has a hydrogen partial pressure $p(H_2)$ of between $10^{-1}$ mbar and $10^{-3}$ mbar, preferably of around approximately $10^{-2}$ mbar. In the case of hydrogen cleaning of EUV mirrors that is performed in-situ in the residual gas atmosphere, a considerable hydrogen partial pressure is generally present. The inventors have discovered, however, that the hydrogen present in the residual gas atmosphere influences the replacement of nitrogen by oxygen in the capping layer only to a small extent, that is to say that the hydrogen cleaning influences the composition of the capping layer composed of silicon oxynitride only to an insignificant extent, such that hydrogen cleaning of the capping layer can be effected by activated hydrogen without the stability of the composition of the capping layer being impaired in the process.

The invention also relates to a method for operating an EUV lithography apparatus embodied in the manner described above, wherein in the method the gas constituents in the residual gas atmosphere and/or the power density of the EUV radiation at the surface of the capping layer are set such that the nitrogen proportion x of the capping layer does not decrease. In order to effectively counteract the conversion, the temperature of the EUV mirror should also be chosen such that it is not excessively high, wherein the temperature should preferably be between approximately 10° C. and approximately 40° C., wherein in particular operation at room temperature (approximately 21° C.) has proved to be advantageous.

As explained above, what can be achieved through a suitable choice of the operating conditions in the EUV exposure apparatus is that the nitrogen proportion in the capping layer remains (virtually) constant over the lifetime of the EUV mirror. In this case, it proves to be advantageous for the capping layer to have an oxygen proportion 0<y<0.4 already before the mirror is introduced into the EUV lithography apparatus, since such a capping layer is less susceptible to replacement of nitrogen by oxygen during the EUV irradiation.

Other features and advantages of the invention are evident from the following description of exemplary embodiments of the invention, with reference to the figures of the drawing, which show details significant to the invention, and from the claims. The individual features can be realized in each case individually by themselves or as a plurality in any desired combination in a variant of the invention.

BRIEF DESCRIPTION OF THE DRAWING

Exemplary embodiments are illustrated in the schematic drawing and are explained in the description below. In the figures.

DETAILED DESCRIPTION OF EXEMPLARY EMBODIMENTS

Figure 1:
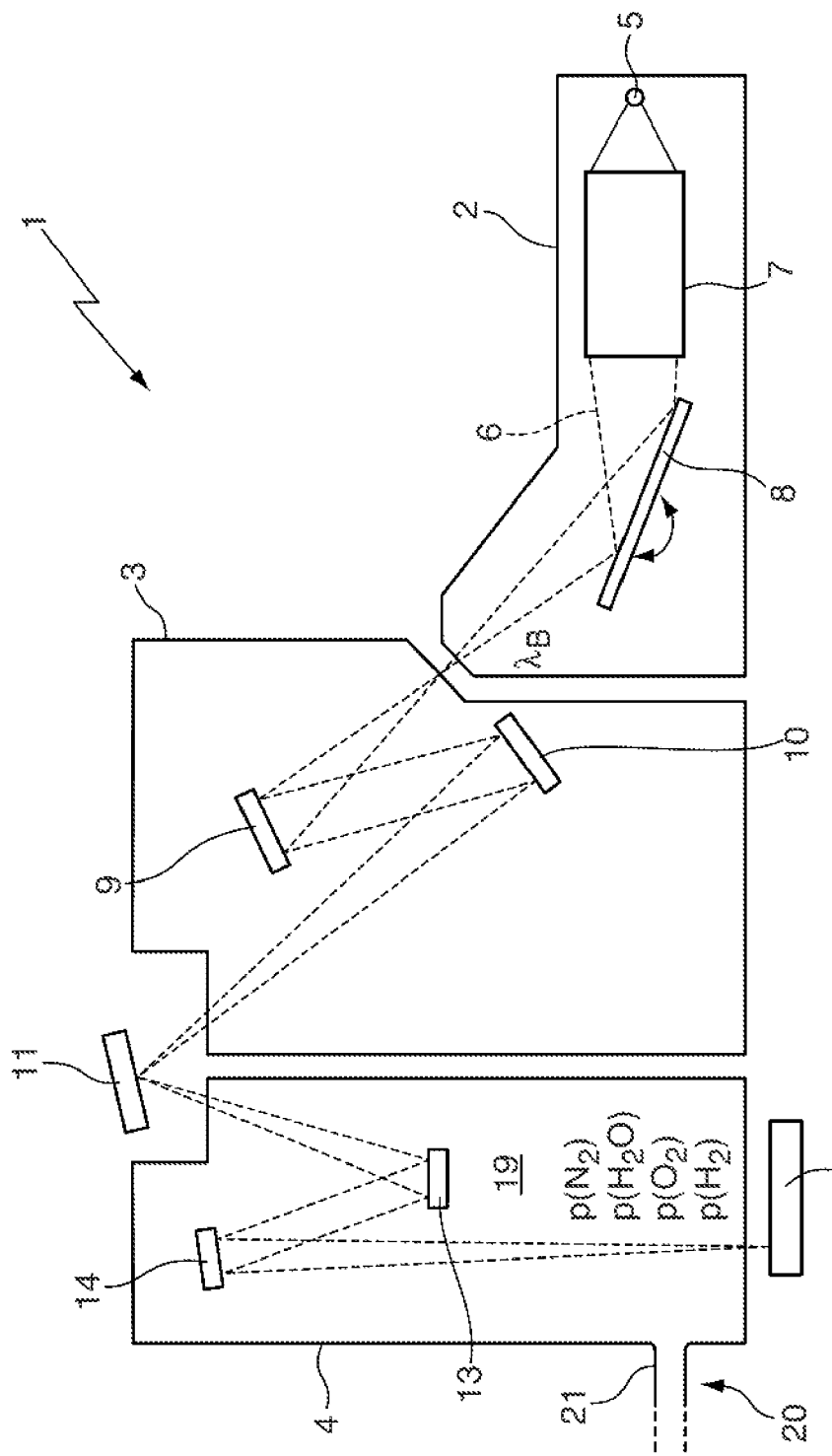
FIG. 1 shows a schematic illustration of an embodiment of an EUV lithography apparatus according to the invention.

FIG. 1 schematically shows a projection exposure apparatus for EUV lithography, which is designated hereinafter as EUV lithography apparatus 1. The EUV lithography apparatus 1 comprises a ray generating system 2, an illumination system 3 and a projection system 4, which are accommodated in separate vacuum housings and arranged successively in a beam path 6 proceeding from an EUV light source 5 of the ray shaping system 2. By way of example, a plasma source or a synchrotron can serve as EUV light source 5. The radiation in the wavelength range of between approximately 5 nm and approximately 20 nm that emerges from the light source 5 is firstly concentrated in a collimator 7. With the aid of a downstream monochromator 8, the desired operating wavelength $\lambda_B$, which is approximately 13.5 nm in the present example is filtered out by variation of the angle of incidence, as indicated by a double-headed arrow. The collimator 7 and the monochromator 8 are embodied as reflective optical elements.

The radiation treated with regard to wavelength and spatial distribution in the ray generating system 2 is introduced into the illumination system 3, which has a first and second reflective optical element 9, 10. The two reflective optical elements 9, 10 direct the radiation onto a photomask 11 as further reflective optical element, which has a structure that is imaged onto a wafer 12 on a reduced scale by the projection system 4. For this purpose, a third and fourth reflective optical element 13, 14 are provided in the projection system 4.

The reflective optical elements 9, 10, 11, 13, 14 each have an optical surface that is subjected to the EUV radiation 6 from the light source 5. In this case, the optical elements 9, 10, 11, 13, 14 are operated under vacuum conditions in a residual gas atmosphere 19. Since the interior of the projection exposure apparatus 1 cannot be baked out, the presence of residual gas constituents in the vacuum environment cannot be completely avoided.

The EUV lithography apparatus 1 has a gas feed device 20 with a feed channel 21, which is connected to a gas reservoir (not shown) and serves for feeding and for discharging different gas constituents into and from the residual gas atmosphere 19 of the EUV lithography apparatus 1. As is shown in FIG. 1, nitrogen ($N_2$), water ($H_2O$), oxygen ($O_2$) and hydrogen ($H_2$) are present, inter alia, as gas constituents in the residual gas atmosphere 19. Corresponding feed channels can also be provided in the illumination system 3 and/or in the ray generating system 2 or else a central feed channel can be provided for the entire EUV lithography apparatus 1. A control device (not shown) serves to control the gas feed device 20 and to control further functions of the EUV lithography apparatus 1.

Figure 2:
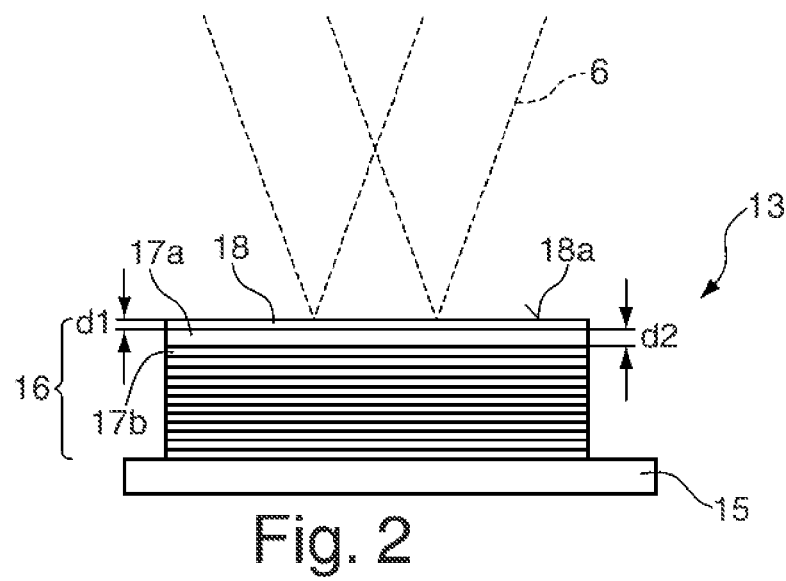
FIG. 2 shows a schematic illustration of an EUV mirror for such an EUV lithography apparatus with a capping layer composed of silicon oxynitride, FIGS. 3a,b show two spectra obtained during an XPS analysis of a capping layer composed of silicon oxynitride, FIGS. 4a,b show a comparison of the reflectivity and respectively of the field intensity with regard to the vacuum interface of a standing wave of a reflective coating with a capping layer composed of silicon oxynitride and respectively with a capping layer composed of silicon oxide as a function of the wavelength, and FIGS. 5a,b show an illustration analogous to FIGS. 4a,b wherein the standing wave has a maximum of the field intensity at the surface of the capping layer.

The construction of one of the reflective optical elements 13 in the EUV lithography apparatus, said element also being designated as EUV mirror hereinafter, is described by way of example hereinafter with reference to FIG. 2. The EUV mirror 13 has a substrate 15 composed of a material having a low coefficient of thermal expansion, which is typically less than 100 ppb/K at 22° C. or over a temperature range of approximately 5° C. to approximately 35° C. One material which has these properties is silicate or quartz glass doped with titanium dioxide, which typically has a silicate glass proportion of more than 90%. One such silicate glass that is commercially available is sold by Corning Inc. under the trade name ULE® (Ultra Low Expansion glass). A further group of materials having a very low coefficient of thermal expansion is glass ceramics, in which the ratio of the crystal phase to the glass phase is set such that the coefficients of thermal expansion of the different phases virtually cancel one another out. Such glass ceramics are offered e.g. by Schott AG under the trade names Zerodur®, and by Ohara Inc. under the trade name Clearceram®. For the reflective optical elements 9, 10 arranged in the illumination system 3, an e.g. metallic substrate material can also be used, if appropriate, instead of a zero expansion material.

A reflective coating 16 is applied to the substrate 15, said reflective coating having a plurality of individual layers 17a, 17b consisting alternately of materials having different refractive indices, specifically in the present case, silicon and molybdenum in the present case. In addition to the individual layers shown in FIG. 2, the reflective coating 16 can also comprise intermediate layers for preventing diffusion or the like. The illustration of such auxiliary layers in the figures has been omitted.

The reflective coating 16 has a capping layer 18 in order to prevent oxidation of the underlying individual layers 17a, 17b and in order to simplify cleaning of contaminating substances attached to the surface 18a of the capping layer 18. In the present example, the capping layer 18 consists of silicon oxynitride ($SiN_xO_Y$), which is applied to a silicon layer 17a of the reflective coating 16. The capping layer 18 has a thickness d1 of e.g. approximately 1.5 nm and is transmissive to the impinging EUV radiation 6. Depending on the application, the layer thickness can be between approximately 1 nm and approximately 20 nm, comparatively large layer thicknesses being used, in particular, in the vicinity of the collector or collimator 7.

In the exemplary embodiment illustrated, the EUV mirror 13 has a planar surface 18a. This was chosen thus merely in order to simplify the illustration, that is to say that the EUV mirror 13 can also have a curved surface form, wherein e.g. concave surface forms or convex surface forms are possible, which can be embodied spherically and also aspherically.

The layers 17a, 17b of the reflective coating 16 and the capping layer 18 are applied to the substrate 15 using a PVD method. In this case, the capping layer 18 was applied to the topmost silicon layer 17a of the multilayer coating 16 via a sputtering process, such that the silicon oxynitride has an amorphous structure. Both the oxygen proportion y and the nitrogen proportion x of the capping layer 18 can be set by a suitable choice of the coating parameters during the sputtering method, wherein advantageous values for the nitrogen proportion x are between approximately 1.0 and approximately 1.4, wherein in particular values of greater than x=1 have proved to be advantageous. The oxygen proportion y is generally y=0.4 or less, wherein a variation of the respective proportions x and y within the capping layer 18 may possibly occur in a process-governed manner. A capping layer 18 having a spatially homogeneous composition in which x=1.0 or x>1.0 and y=0.4 or y<0.4 is particularly advantageous.

As described above, the exact composition of the silicon oxynitride $SiN_xO_y$ is dependent on the coating parameters. During sputtering, a magnetic field can additionally be used (magnetron sputtering) and, if appropriate, pulsed discharges can be used for the coating, as in the case of so-called "High Power Impulse Magnetron Sputtering (HiPIMS)" or in the case of "High Power Pulsed Magnetron Sputtering (HPPMS)", which are described for example in WO 2010/127845 A1 cited in the introduction. Instead of a PVD method, it is also possible, if appropriate, to apply the capping layer 18 using a CVD method, in particular a PE-CVD or LP-CVD method, cf. the website of Crystec at http://www.crystec.com/trinitre-.htm or U.S. Pat. No. 5,773,100 cited in the introduction.

During the exposure operation of the EUV lithography apparatus 1, by virtue of the EUV radiation 6 under disadvantageous conditions part of the nitrogen present in the silicon oxynitride $SiN_xO_Y$ of the capping layer 18 can be replaced by oxygen, as was confirmed by an XPS analysis of the capping layer 18 after an irradiation duration of approximately 10 hours. In this case, particularly in partial regions of the capping layer 18 in which the power density of the EUV radiation 6 was particularly high and e.g. more than 200 mW/mm², if appropriate more than 1000 mW/mm², a considerable portion of the nitrogen of the capping layer 18 was replaced by oxygen.

In addition, by suitably choosing the gas constituents in the residual gas atmosphere 19, more specifically the partial pressures of said constituents, it is also possible for such replacement to be prevented or significantly slowed down. Indications that the composition of the residual gas atmosphere 19 has effects on the nitrogen proportion or the oxygen proportion in the $SiN_xO_y$ material of the capping layer 18 are evident from an XPS spectral analysis (cf. FIGS. 3a,b) of a capping layer 18 of a multilayer coating 16, said capping layer 18 being applied to a silicon layer 17a via a sputtering process, wherein the thicknesses of the layers 17a, 17b were chosen such that these layers have a reflection maximum at the operating wavelength $\lambda_B$ of 13.5 nm.

Figure 3A:
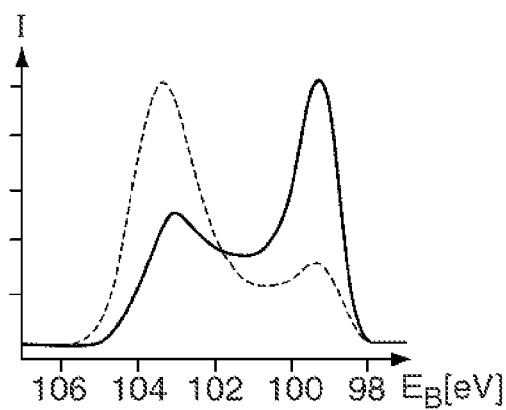

The graphs in FIGS. 3a,b illustrate the Si 2p bond of the XPS spectrum (as a function of the bond energy $E_B$), wherein the intensity I of the photoelectrons which emerge at a shallow angle from the surface 18a of the capping layer 18 is represented by a dashed curve, while the intensity I of photoelectrons which emerge at a steep angle (virtually perpendicularly) with respect to the surface 18a is represented as a solid line. The solid intensity curve thus includes information about the composition of the capping layer 18 at a greater depth, whereas the dashed intensity curve substantially shows information about a near-surface depth range of approximately 1-2 nm of the capping layer 18.

In FIGS. 3a,b it can be discerned that the Si 2p spectrum substantially has three peaks at different bond energies $E_B$. A first bond energy $E_B$ at approximately 103.5 eV is characteristic of the oxide bond, a second bond energy $E_B$ at approximately 102 eV corresponds to the silicon nitride bond, while a third bond energy $E_B$ of approximately 99 eV corresponds to the unbound semiconductor state, i.e. unbound, elemental silicon.

Figure 3B:
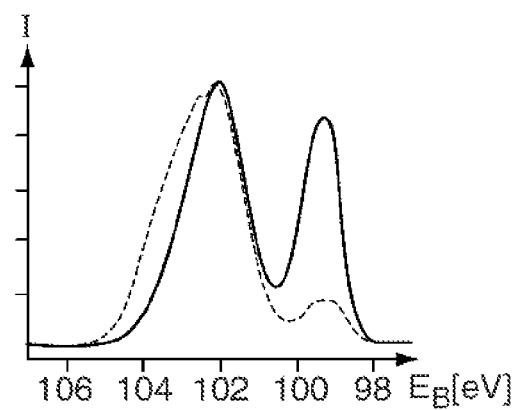

The two graphs in FIG. 3a and FIG. 3b differ in that additional nitrogen in gaseous form was added during the coating process in FIG. 3b, while this was not the case in FIG. 3a. Comparison between FIG. 3a and FIG. 3b clearly reveals that the oxygen peak at approximately 103.5 eV in FIG. 3b is significantly smaller than in FIG. 3a, and that conversely the peak of the nitride bond at approximately 102 eV has risen significantly, i.e. the composition or the stoichiometry of the silicon oxynitride material essentially depends on the gas atmosphere during coating.

In order to keep the material composition of the capping layer as constant as possible during the irradiation with EUV light 6 and, in particular, to prevent replacement of nitrogen by oxygen in the capping layer material, the partial pressures of the gas constituents in the residual gas atmosphere 19 of the EUV lithography apparatus 1 should therefore be set in a suitable manner. In particular, the oxygen partial pressure $p(O_2)$ in the residual gas atmosphere 19 should be between approximately $10^{-7}$ mbar and $10^{-11}$ mbar, for example approximately $10^{-9}$ mbar. By contrast, the nitrogen partial pressure $p(N_2)$ in the residual gas atmosphere 19 should be higher and between approximately $10^{-2}$ mbar and $10^{-6}$ mbar, for example approximately $10^{-4}$ mbar. The partial pressure of water $p(H_2O)$ in the residual gas atmosphere 19 should also not be excessively high, in order to prevent a reaction of the oxygen present in the water with the material of the capping layer 18. Typical values of the water partial pressure ($p(H_2O)$) are between approximately $10^{-5}$ mbar and $10^{-9}$ mbar, for example approximately $10^{-7}$ mbar. The hydrogen partial pressure $p(H_2)$, too, may possibly influence the stoichiometry of the capping layer 18 and should therefore be in an interval of between approximately $10^{-1}$ mbar and approximately $10^{-3}$ mbar, for example approximately $10^{-2}$ mbar.

By setting suitable conditions in the EUV lithography apparatus 1, it is thus possible for the composition of the capping layer 18 composed of silicon oxynitride to be kept (virtually) stable during the entire lifetime of the EUV mirror 13. In particular, reversible conversion processes that take place substantially only on the surface 18a itself or only a few Angstroms directly below the surface 18a can be used, if appropriate, to set a desired nitrogen proportion in the capping layer 18 at least at the surface 18a.

Since an undesired change in the composition of the capping layer 18 may possibly occur when there is an undesired change in the conditions in the residual gas atmosphere 19 or when a high power density of the EUV radiation is used, it has proved to be advantageous for an antinode or a node of a standing wave that forms in the reflective coating 16 during the irradiation with EUV light 6 to be positioned directly at the surface 18a of the capping layer or—if this is not possible—for the distance between the antinode or node of the standing wave and the surface 18a to be chosen such that it is not more than $0.1\lambda_S$.

Figure 4A:
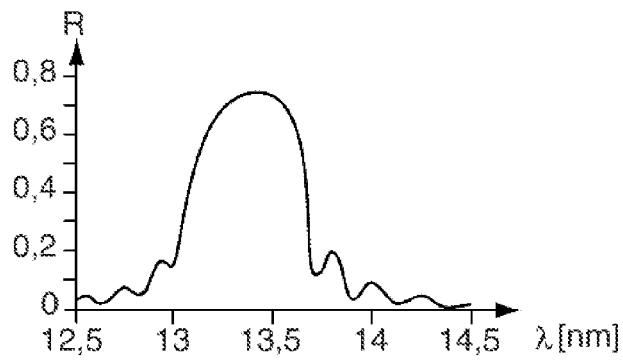
Figure 4B:
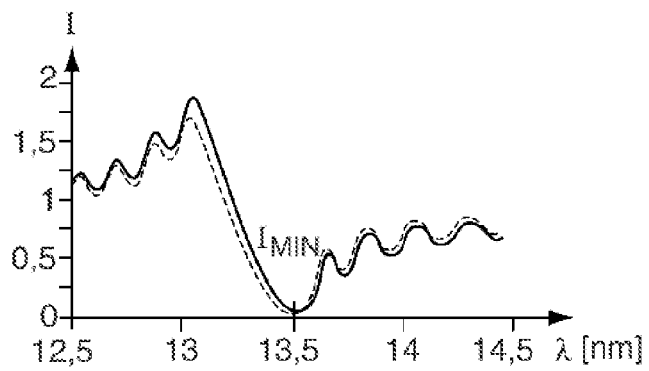

In order to achieve this, in particular the thickness d1 of the capping layer 18 and the thickness d2 of the underlying silicon layer 17a (and also, if appropriate, of further layers 17a, 17b of the reflective coating 16) can be chosen suitably. If the above condition is met, even upon complete replacement of the nitrogen by oxygen in the capping layer 18 the change in the reflectivity is comparatively small, as can be discerned with reference to FIG. 4a, which shows the reflectivity R when using a silicon nitride capping layer as a function of the wavelength λ at which a node of the standing wave is formed at the surface 18a. The change in the reflectivity R upon the complete replacement of nitrogen by oxygen is only ΔR/R=−0.02% in this case, and so the associated reflectivity curve cannot be discerned in FIG. 4a since, with the scaling chosen, it corresponds to the reflectivity curve for silicon nitride. FIG. 4b shows the field intensity I at the surface 18a of the capping layer 18 as a function of the wavelength λ, wherein it can clearly be discerned that said field intensity has an intensity minimum $I_{min}$ (i.e. a node of the standing wave) at the operating wavelength $\lambda_S$ of 13.5 nm.

Figure 5A:
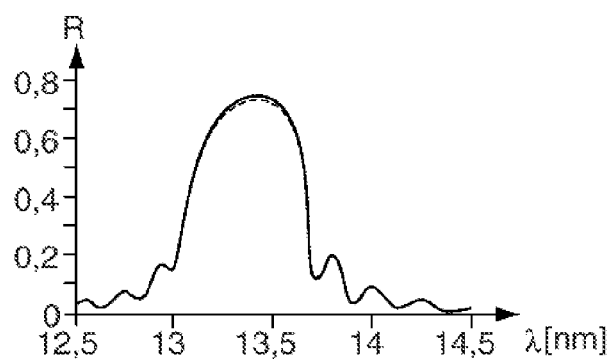
Figure 5B:
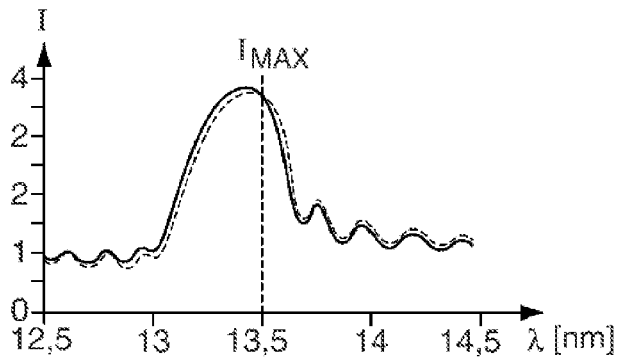

When an antinode is present at the surface 18a of the capping layer 18, the change in the reflectivity when nitrogen is replaced by oxygen is greater and is ΔR/R=−2.1%, as is indicated by a dashed reflectivity curve in FIG. 5a. As is shown in FIG. 5b, the standing wave at the surface 18a of the reflective coating 16 in this case has an intensity maximum $I_{max}$ approximately at the operating wavelength $\lambda_B$ of 13.5 nm. In order to minimize a reduction of the reflectivity R upon the replacement of oxygen by nitrogen in the capping layer 18, it is therefore particularly advantageous to position an intensity minimum of the standing wave at the location of the surface 18a.

Instead of silicon oxynitride, if appropriate it is also possible to use other oxynitride compounds for the capping layer 18, for example compounds of oxynitrides with other semiconductors or with metallic constituents such as titanium, zirconium or aluminum or compounds with semimetals such as boron. Such oxynitride materials can also typically be applied in the manner described above. In the case of capping materials composed of these materials, too, what can generally be achieved by the measures described above is that the nitrogen proportion remains constant or does not decrease during the EUV irradiation.

The use of a stable capping layer 18 composed of silicon oxynitride, in particular, has proved to be advantageous for removing impurities or particles, in particular metals such as e.g. tin or carbon, from the surface of the EUV mirror 13, for which purpose hydrogen cleaning is advantageously carried out, during which activated hydrogen, in particular in the form of hydrogen radicals or hydrogen ions, is applied to the surface.

The hydrogen cleaning can be carried out by setting a suitable hydrogen partial pressure $p(H_2)$ in the residual gas atmosphere. The hydrogen can be activated by the EUV radiation 6 in proximity to the surface 18a and in the process can be converted into hydrogen ions or hydrogen radicals which clean contaminating substances such as tin or carbon away from the surface 18a. For the hydrogen cleaning it is also possible, however, to provide additional devices in the EUV lithography apparatus 1, for example cleaning heads that serve to generate a hydrogen-containing gas flow directed onto the surface 18a. Cleaning heads of this type are described for example in WO 2009/059614 A1 from this applicant, which is incorporated by reference into the disclosure of the present application. The hydrogen in the gas flow can be activated hydrogen, wherein the activation can be effected for example using an electric field, as is described in WO 2009/059614 A1, or by guiding the (molecular) hydrogen along a heating wire for the purpose of activation.

The invention claimed is:

1. A mirror, comprising:
   a substrate and a reflective coating reflective to extreme-ultraviolet (EUV) radiation, wherein the reflective coating comprises a capping layer composed of an oxynitride, wherein a nitrogen proportion x in the oxynitride $N_xO_y$ is between 0.4 and 1.4 and an oxygen proportion y in the oxynitride $N_xO_y$, is between 0 and 0.4.

2. The mirror according to claim 1, wherein the oxynitride is a metal oxynitride compound, a semimetal oxynitride compound or a semiconductor oxynitride compound.

3. The mirror according to claim 1, wherein the capping layer is formed from $SiN_xO_y$.

4. The mirror according to claim 3, wherein the capping layer is formed from amorphous $SiN_xO_y$.

5. The mirror according to claim 1, wherein the capping layer is formed by physical vapor deposition.

6. The mirror according to claim 1, wherein a nitrogen proportion x in the oxynitride $N_xO_y$ is x>1.

7. The mirror according to claim 1, wherein the capping layer is applied to a silicon layer of the reflective coating.

8. The mirror according to claim 1, wherein the reflective coating has a reflection maximum at an operating wavelength $\lambda_B$ in the EUV wavelength range and a maximum ($I_{max}$) or a minimum ($I_{min}$) of the field intensity (I) of a standing wave that forms upon the reflection of radiation at the operating wavelength $\lambda_B$ at the reflective coating is arranged at a distance of $0.1\lambda_B$ or less from a surface of the capping layer.

9. An extreme-ultraviolet (EUV) lithography apparatus, comprising:
   at least one mirror according to claim 1, which is arranged in a residual gas atmosphere of the EUV lithography apparatus.

10. The EUV lithography apparatus according to claim 9, wherein the residual gas atmosphere has a nitrogen partial pressure $p(N_2)$ of between $10^{-2}$ mbar and $10^{-6}$ mbar.

11. The EUV lithography apparatus according to claim 9, wherein the residual gas atmosphere has an oxygen partial pressure ($p(O_2)$) of between $10^{-7}$ mbar and $10^{-11}$ mbar.

12. The EUV lithography apparatus according to claim 9, wherein the residual gas atmosphere has a water partial pressure ($p(H_2O)$) of between $10^{-5}$ mbar and $10^{-9}$ mbar.

13. The EUV lithography apparatus according to claim 9, wherein the residual gas atmosphere has a hydrogen partial pressure ($p(H_2)$) of between $10^{-1}$ mbar and $10^{-3}$ mbar.

14. A method for operating an EUV lithography apparatus according to claim 9, comprising setting at least one of (i) the gas constituents in the residual gas atmosphere and (ii) the power density of the EUV radiation at a surface of the capping layer such that the nitrogen proportion x of the capping layer does not decrease.

* * * * *